(12) United States Patent
Goto et al.

(10) Patent No.: US 8,902,581 B2
(45) Date of Patent: Dec. 2, 2014

(54) ELECTRONIC DEVICE

(75) Inventors: Shinji Goto, Osaka (JP); Kazuhiro Shiraga, Osaka (JP); Naoyuki Ito, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 125 days.

(21) Appl. No.: 13/556,218

(22) Filed: Jul. 24, 2012

(65) Prior Publication Data

US 2013/0027881 A1  Jan. 31, 2013

(30) Foreign Application Priority Data

Jul. 25, 2011 (JP) ................................ 2011-162219
Jul. 20, 2012 (JP) ................................ 2012-161396

(51) Int. Cl.
*H05K 7/20* (2006.01)
*G06F 1/20* (2006.01)
*F28F 7/00* (2006.01)

(52) U.S. Cl.
CPC ............ *G60F 1/203* (2013.01); *H05K 7/20145* (2013.01)
USPC .................... 361/679.49; 165/80.3; 165/80.4; 165/104.33; 257/715; 257/722; 361/679.47; 361/695; 361/700

(58) Field of Classification Search
CPC .................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/0026–5/0082; H05K 7/005–7/08; H05K 7/1422–7/1437; H05K 5/00–5/0021; H05K 5/0086–5/06; H05K 5/069; H05K 7/00; H05K 7/20; H05K 9/00; H05K 1/0218–1/0219; H05K 1/00; H05K 3/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H02B 1/00; H01R 4/00; H01R 9/00; H01R 13/00; H01K 1/00–3/00
USPC ............. 361/679.01–679.02, 679.26–679.28, 361/679.55–679.58, 679.46–679.54, 361/688–723; 174/15.1–15.2, 16.1–16.3; 165/80.2–80.3, 185, 104.33; 257/712–722

See application file for complete search history.

(56) References Cited

U.S. PATENT DOCUMENTS 6,442,025 B2 *  8/2002  Nakamura et al. ............ 361/695
6,643,129 B2 * 11/2003  Fujiwara .................. 361/679.47

(Continued)

FOREIGN PATENT DOCUMENTS

JP  2008-306001 A  12/2008

*Primary Examiner* — Zachary M Pape
*Assistant Examiner* — Razmeen Gafur
(74) *Attorney, Agent, or Firm* — James W. Judge

(57) ABSTRACT

A notebook computer is provided with: a casing in which electronic components including a CPU are accommodated; and a heat-dissipating unit including a heat-dissipating component 37 having plural fins, and a fan 31 for supplying air to the heat-dissipating component 37. A communicating path 35 is formed between an air outlet 32*b* of the fan 31 and a surface 37*b* of the heat-dissipating component 37 on a side thereof that opposes the fan 31, so as to communicate them. An opening 32*c* is formed in a fan case 32 between the air outlet 32*b* and a main unit 33 of the fan. A duct 36 is provided so as to communicate the opening 32*c* with the heat-dissipating component 37. With this structure, an electronic device can be provided which has a built-in heat-dissipating unit that can restrain increase in cost and weight, and remove dust on the heat-dissipating component.

6 Claims, 15 Drawing Sheets

(56) References Cited

U.S. PATENT DOCUMENTS

| | | | |
|---|---|---|---|
| 6,728,102 B2 * | 4/2004 | Ishikawa et al. | 361/679.48 |
| 7,310,227 B2 * | 12/2007 | Kusamoto et al. | 361/695 |
| 7,518,861 B2 * | 4/2009 | Lev et al. | 361/679.52 |
| 7,535,712 B2 * | 5/2009 | Tanaka | 361/700 |
| 7,542,290 B2 * | 6/2009 | Tracy et al. | 361/696 |
| 7,548,425 B2 * | 6/2009 | Hata et al. | 361/699 |
| 7,649,738 B2 * | 1/2010 | Hata et al. | 361/679.52 |
| 7,656,665 B2 * | 2/2010 | Lin et al. | 361/700 |
| 7,667,961 B2 * | 2/2010 | Fujiwara | 361/679.47 |
| 7,679,907 B2 * | 3/2010 | Kaneko | 361/695 |
| 7,688,579 B2 * | 3/2010 | Hwang et al. | 361/679.52 |
| 7,697,288 B2 * | 4/2010 | Okutsu | 361/695 |
| 7,719,831 B2 * | 5/2010 | Fujiwara | 361/679.47 |
| 7,903,402 B2 * | 3/2011 | Tomioka et al. | 361/679.47 |
| 7,952,877 B2 * | 5/2011 | Okutsu | 361/700 |
| 7,961,467 B2 * | 6/2011 | Hongo | 361/700 |
| 8,102,649 B2 * | 1/2012 | Ma et al. | 361/679.47 |
| 8,125,783 B2 * | 2/2012 | Tanaka | 361/720 |
| 8,270,165 B2 * | 9/2012 | Kaneko | 361/700 |
| 8,379,383 B2 * | 2/2013 | Sugiura et al. | 361/679.47 |
| 8,405,997 B2 * | 3/2013 | Fujiwara | 361/711 |
| 8,717,756 B2 * | 5/2014 | Ito et al. | 361/679.47 |
| 2004/0001316 A1 * | 1/2004 | Kamikawa et al. | 361/700 |
| 2005/0045310 A1 * | 3/2005 | Okutsu et al. | 165/80.3 |
| 2006/0254790 A1 * | 11/2006 | Hata et al. | 174/16.3 |
| 2009/0129020 A1 * | 5/2009 | Fujiwara | 361/697 |
| 2009/0231809 A1 * | 9/2009 | Koide et al. | 361/697 |
| 2009/0262499 A1 * | 10/2009 | Chou | 361/695 |
| 2009/0321047 A1 * | 12/2009 | Chen | 165/80.3 |
| 2010/0089549 A1 * | 4/2010 | Su et al. | 165/80.3 |
| 2010/0238619 A1 * | 9/2010 | Shirasaka | 361/679.08 |

* cited by examiner

ELECTRONIC DEVICE

BACKGROUND

1. Field

The present disclosure relates to electronic devices with built-in heat-dissipating units having a heat-dissipating component furnished with a plurality of heat-exchanging fins.

2. Description of the Related Art

In heat-dissipating units of this sort, built into notebook computers and the like, heat from electronic components (heat-emitting components), such as central processing units (CPUs), which emit heat during operation, is transferred through a heat pipe or the like to a heat-dissipating component, heat exchange with air (cooling air) supplied from a fan is made to occur, and the heated air is released to the exterior of the casing of the notebook computer or the like, thereby effectively cooling the heat-emitting components.

In such conventional heat-dissipating units, in order to enhance the heat-dissipating effect, it is effective to increase the surface area of the fins, and a plurality of fins are arrayed in a narrow, limited space at a narrow spacing. However, when the spacing at which the plurality of fins are arrayed is narrow, fine dust contained in the air (cooling air) supplied from the fan is likely to adhere to, particularly, the surface of the heat-dissipating component (that is, the inflow surface) on the side that opposes the fan (hereinafter, referred to as the inflow side since it is where air (cooling air) flows in). Once dust adheres to the heat-dissipating component, dust is likely to accumulate rapidly, and the accumulated dust covers the entire surface of the heat-dissipating component on the inflow side. As a result, it becomes difficult for cooling air from the fan to be sent into the gaps between adjacent fins, and consequently there is significant deterioration in the heat-dissipating effect of the heat-dissipating unit.

To address this issue, as described below, a heat-dissipating unit having a mechanism for removing dust clinging to the heat-dissipating component has been suggested to date, in Japanese Laid-Open Patent Publication No. 2008-306001.

Referring to FIG. 15, a heat-dissipating unit suggested in the aforementioned Japanese Laid-Open Patent Publication No. 2008-306001 includes: a heat-dissipating component 50 having a plurality of flow paths 51 formed therein, and having a plurality of heat-exchanging fins 52; a brush 53, disposed on the inflow side of the heat-dissipating component 50, which acts as a cleaning component for removing dust on the heat-dissipating component 50 by being inserted into the flow paths 51; a brush rotation pivot 55 and a brush driving pivot 56 for supporting the brush 53 such that the brush 53 is mounted rotatably in an exterior case 54; and a brush driving section 57, such as, for example, a motor, capable of driving the brush 53.

SUMMARY

However, with an electronic device in which the heat-dissipating unit suggested in Japanese Laid-Open Patent Publication No. 2008-306001 is installed, it is necessary to additionally build in the brush and the motor or similar brush-driving section. Therefore, the number of components and the number of assembly process steps are increased, and, further, space for housing these components has to be set aside. The consequent problem that arises is that the cost increases. A further problem that arises with an electronic device in which the heat-dissipating unit suggested in Japanese Laid-Open Patent Publication No. 2008-306001 is installed is that the increase in the number of components leads to an increase in the device weight.

An object of the present disclosure is to make available an electronic device which has a built-in heat-dissipating unit that makes it possible to restrain increase in cost and increase in the weight, and enables the removal of dust on the heat-dissipating component with a simplified structure.

An electronic device according to the present disclosure is an electronic device that has: a casing in which electronic components including a heat-emitting component that emits heat during operation are accommodated; and a heat-dissipating unit including a heat-dissipating component having a plurality of fins to which heat is transferred from the heat-emitting component, and a fan for supplying air to the heat-dissipating component, whereby heat transferred from the heat-emitting component to the heat-dissipating component is heat-exchanged with air supplied from the fan, releasing the heated air to the exterior of the casing; and the electronic device includes: a communicating path, at least a bottom side of which is open, formed between an air outlet of the fan and a surface of the heat-dissipating component on a side thereof that opposes the fan, so as to communicate the fan air outlet with the heat-dissipating component surface; an opening formed in a fan case of the fan, between the air outlet and a main unit of the fan; and an airflow path for communicating said opening with the heat-dissipating component.

In this structure, an electronic device can be provided which has a built-in heat-dissipating unit that makes it possible to restrain increase in cost and increase in the weight, and enables the removal of dust on the heat-dissipating component with a simplified structure.

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventors provide the following description and the accompanying drawings in order to allow a person of ordinary skill in the art to sufficiently understand the present disclosure, and the description and the drawings are not intended to restrict the subject matter of the scope of patent claims.

Hereinafter, an exemplary case in which an electronic device is a notebook computer will be described in more detail according to an embodiment.

[Structure of Electronic Device]

Figure 1:
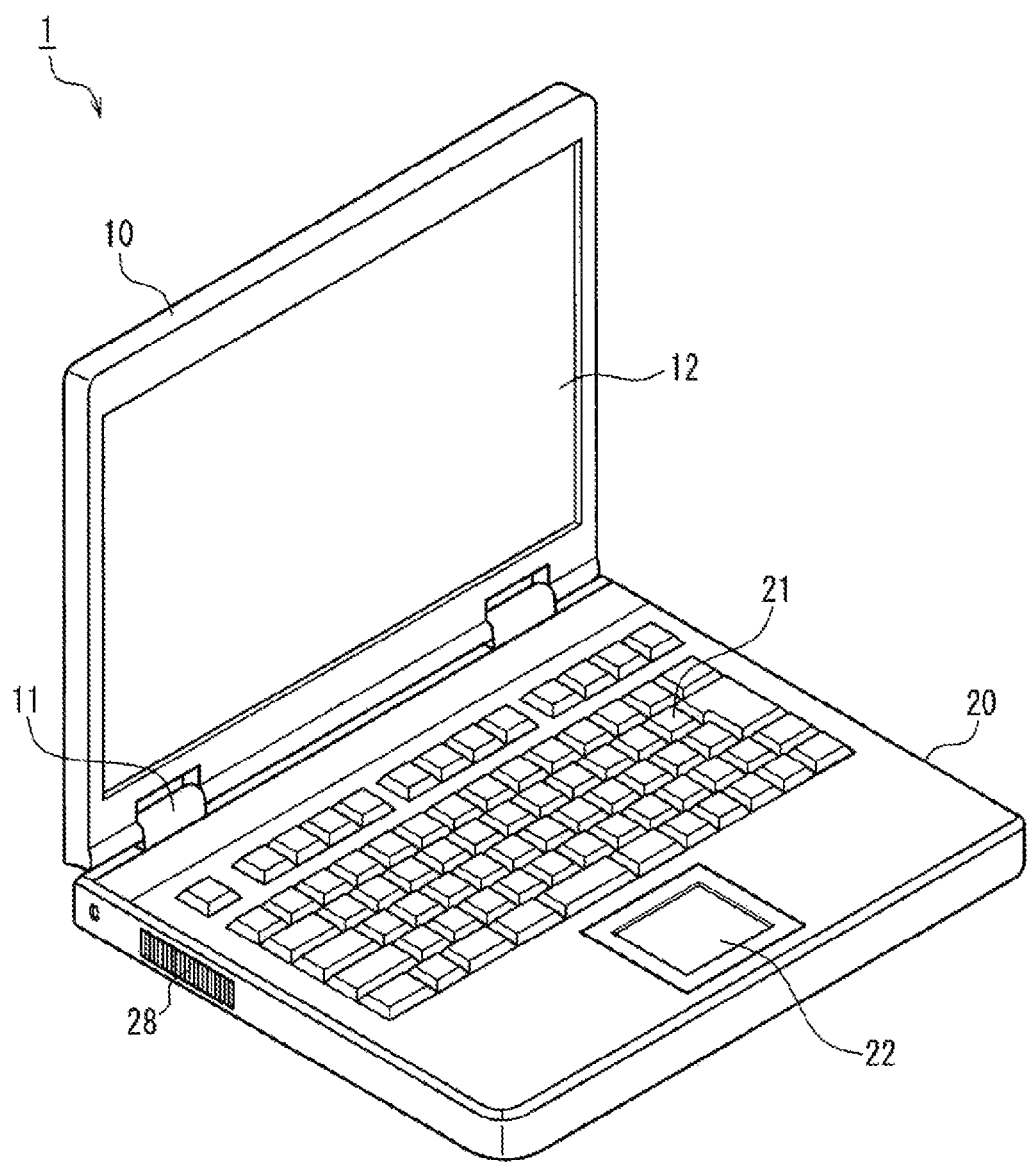
FIG. 1 is a schematic perspective view of the external structure of a notebook computer.

FIG. 1 is a schematic perspective view of an external structure of a notebook computer 1 according to the present embodiment.

As shown in FIG. 1, in the notebook computer 1, a cover component 10 having a display device 12, such as a liquid crystal panel, disposed on an inner side surface thereof is mounted so as to be pivotable, by means of a hinge mechanism 11, relative to a main unit 20 having input devices, such as a keyboard 21 and a pointing device 22, disposed on the surface thereof. In the following description, "upper" represents a direction in which the main unit 20 is opposed to the display device 12 when the cover component 10 having the display device 12 covers the main unit 20 by rotating about the pivot of the hinge mechanism 11, and represents a direction from the main unit 20 toward the display device 12 when the cover component 10 covers the main unit 20. "Lower" represents a direction opposite thereto.

Inside the main unit 20, a not-illustrated secondary battery acting as a power supply for operating the notebook computer 1, a not-illustrated hard disk drive (HDD) acting as a main storage device, and other electric components are disposed. The notebook computer 1 can include, for example, an antenna module for wireless LAN communications, a disk drive for Blu-ray Discs (registered trademark) and DVD discs, a web camera device, an audio microphone and loudspeaker, and various other input/output terminals. The function and form thereof are the same as those of conventionally well-known notebook computers, and illustration and detailed description thereof are not given.

[1-1. Structure of Heat-dissipating Unit]

Figure 2:
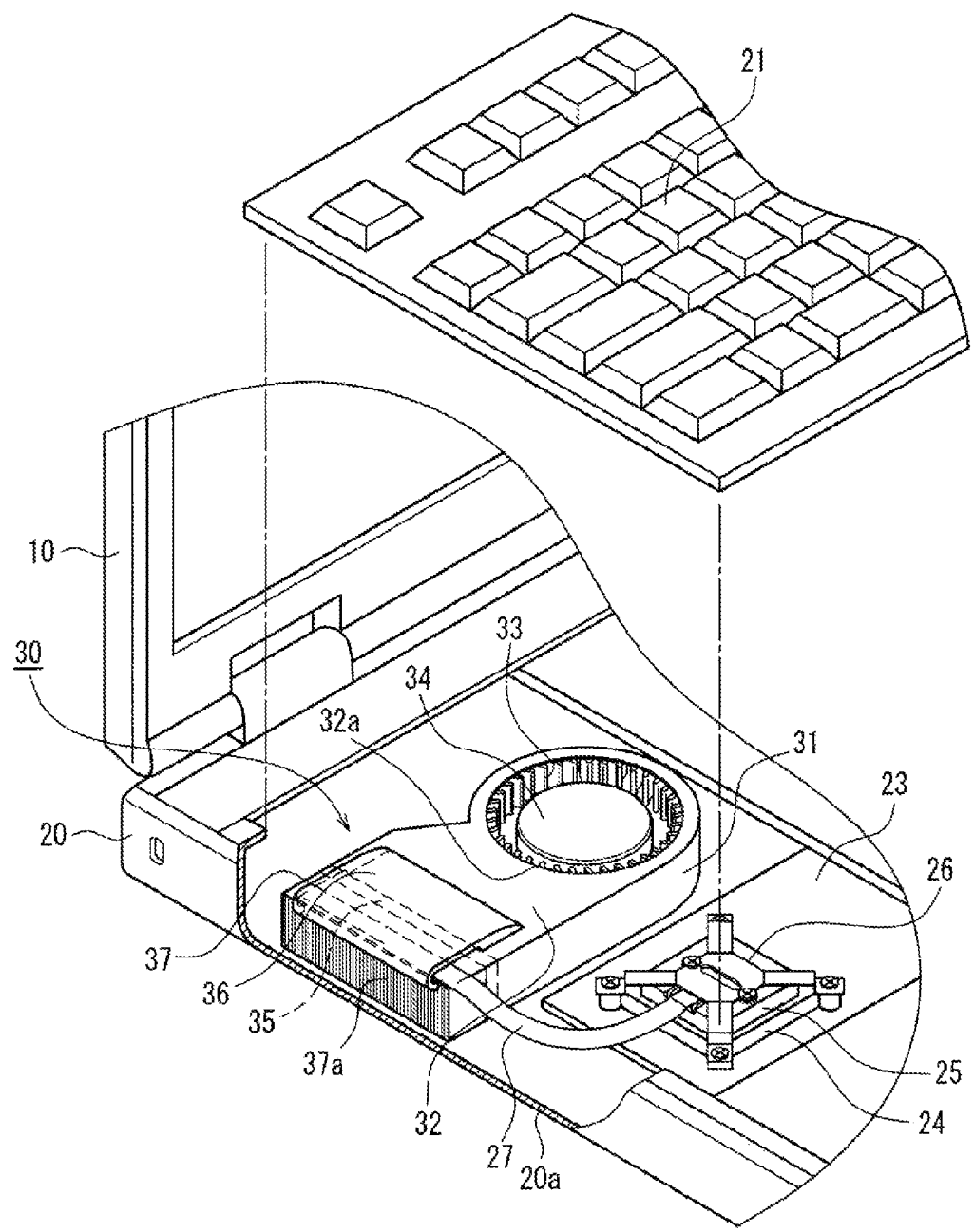
FIG. 2 is a schematic exploded perspective view of the notebook computer having a built-in heat-dissipating unit, illustrating main components of the heat-dissipating unit.
Figure 3:
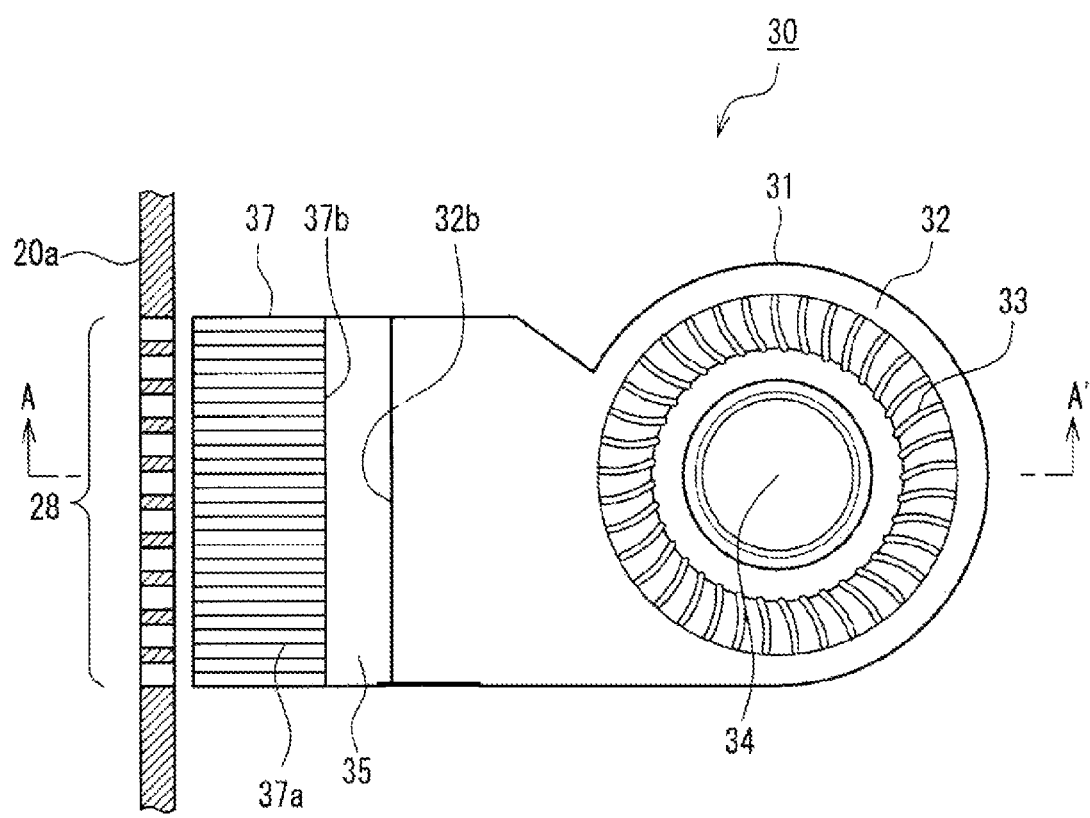
FIG. 3 is a schematic horizontal cross-sectional view of a structure of the heat-dissipating unit.
Figure 4:
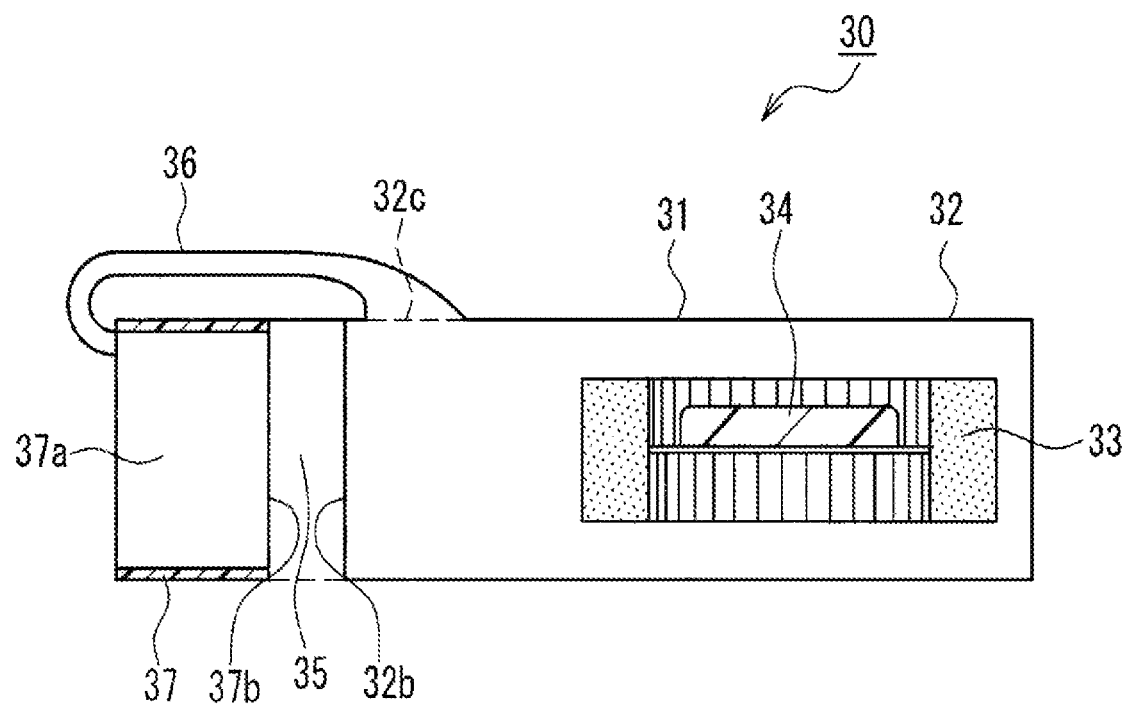
FIG. 4 is a schematic cross-sectional view (schematic vertical cross-sectional view) taken along the line A-A' shown in FIG. 3 (with the casing not illustrated)

Next, a structure of a heat-dissipating unit 30 built into the notebook computer 1 will be described with reference to FIG. 2 to FIG. 4. FIG. 2 is a schematic exploded perspective view illustrating main components of the heat-dissipating unit 30. FIG. 3 is a schematic horizontal cross-sectional view of the structure of the heat-dissipating unit 30. FIG. 4 is a schematic cross-sectional view (schematic vertical cross-sectional view) taken along the line A-A' shown in FIG. 3. FIG. 2 illustrates, in an enlarged manner, only a central processing unit (CPU) 24 and its environs, the CPU 24 being representative of a heat-emitting component whose temperature during operation goes highest among the various electronic components disposed in the main unit 20, and the heat-dissipating unit 30, for releasing heat emitted from the CPU 24 to the exterior of a casing 20a forming an exterior case of the main unit 20, and the unit 30 environs. In FIG. 4, the casing 20a is not illustrated As shown in FIG. 2, the CPU 24 is mounted and disposed on a circuit substrate 23, below the keyboard 21 disposed on the surface, inside the main unit 20 of the notebook computer 1. On the top surface of the CPU 24, a heat receiving section 25 is disposed for receiving heat generated while the CPU 24 is operating. The heat receiving section 25 is mechanically and thermally fixed to the CPU 24 that is a heat source, so as to be pressed against the CPU 24, by means of a fixing component 26 having spring-like legs.

To the heat receiving section 25, one end of a heat pipe 27 made of, for example, copper is connected for transferring the received heat to the heat-dissipating unit 30, and the other end of the heat pipe 27 is mechanically and thermally connected to the top surface of a heat-dissipating component 37 described below. The heat pipe 27 is formed of, for example, copper in a tubular shape, and has sealed therein a heat conductive medium, such as an alternative for chlorofluorocarbon, having a high heat conductivity, thereby efficiently transferring, to the heat-dissipating component 37, heat received from the CPU 24 by the heat receiving section 25.

The heat-dissipating unit 30 includes: the heat-dissipating component 37 having a plurality of fins 37a to which heat is transferred from the CPU 24; and a fan 31 for supplying air (cooling air) to the heat-dissipating component 37. As described above, the other end of the heat pipe 27 is mechanically and thermally connected to the top surface of the heat-dissipating component 37. Heat exchange between air (cooling air) supplied from the fan 31, and heat transferred from the CPU 24 to the heat-dissipating component 37 is made to occur, and the heated air is released to the exterior of the casing 20a. The heated air is released to the exterior of the casing 20a through a discharge outlet 28 (see FIG. 1, and FIG. 3 referred to below) that is formed as slits in the casing 20a so as to correspond to the shape of the heat-dissipating component 37. Further, air (cooling air) to be supplied from the fan 31 to the heat-dissipating component 37 is drawn in through an air inlet 32a formed in the top surface of a fan case 32.

As shown in FIG. 2 to FIG. 4, in the fan 31, a fan main unit 33 accommodated in the fan case 32 spins about a rotation shaft 34 as its axial center, to draw in ambient air through the air inlet 32a which is formed in the top surface of the fan case 32. Air having been drawn in through the air inlet 32a is introduced into the heat-dissipating component 37 through an inflow surface 37b of the heat-dissipating component 37, which is opposed to and in close association with an air outlet 32b. Air having been introduced into the heat-dissipating component 37 passes, as cooling air, through gaps where the plurality of fins 37a oppose each other, and is discharged through a discharge outlet surface of the heat-dissipating component 37. The shape of the entirety of the fan 31, the shape of the air inlet 32*a*, the shape of the fan main unit 33 that spins about the rotation shaft 34, and the like as shown in FIG. 2 to FIG. 4 are exemplary ones. The fan 31 may be any of various types of cooling fans which can draw in ambient air through an air inlet, and discharge air through an air outlet, as conventionally used.

The heat-dissipating component 37 is made of a metal having a high heat conductivity, such as copper, for example, and has the plurality of fins 37*a* that are formed as a plurality of thin-plate-like components so as to extend parallel to the direction in which cooling air discharged from the fan 31 flows toward the exterior of the casing 20*a*. The cooling air having passed through the gaps among the fins 37*a* of the heat-dissipating component 37 is discharged outside the casing 20*a* through the discharge outlet 28 that is formed as slits in the casing 20*a* so as to correspond to the shape of the heat-dissipating component 37. The bottom surface of the heat-dissipating component 37 is flush with the bottom surface of the air outlet 32*b* of the fan 31, and the size of the heat-dissipating component 37 is such that, particularly, the width and the height of the heat-dissipating component 37 as viewed from the fan 31 side are equal to the width and the height of the air outlet 32*b* of the fan 31.

[1-2. Dust Removal Mechanism]

Figure 5:
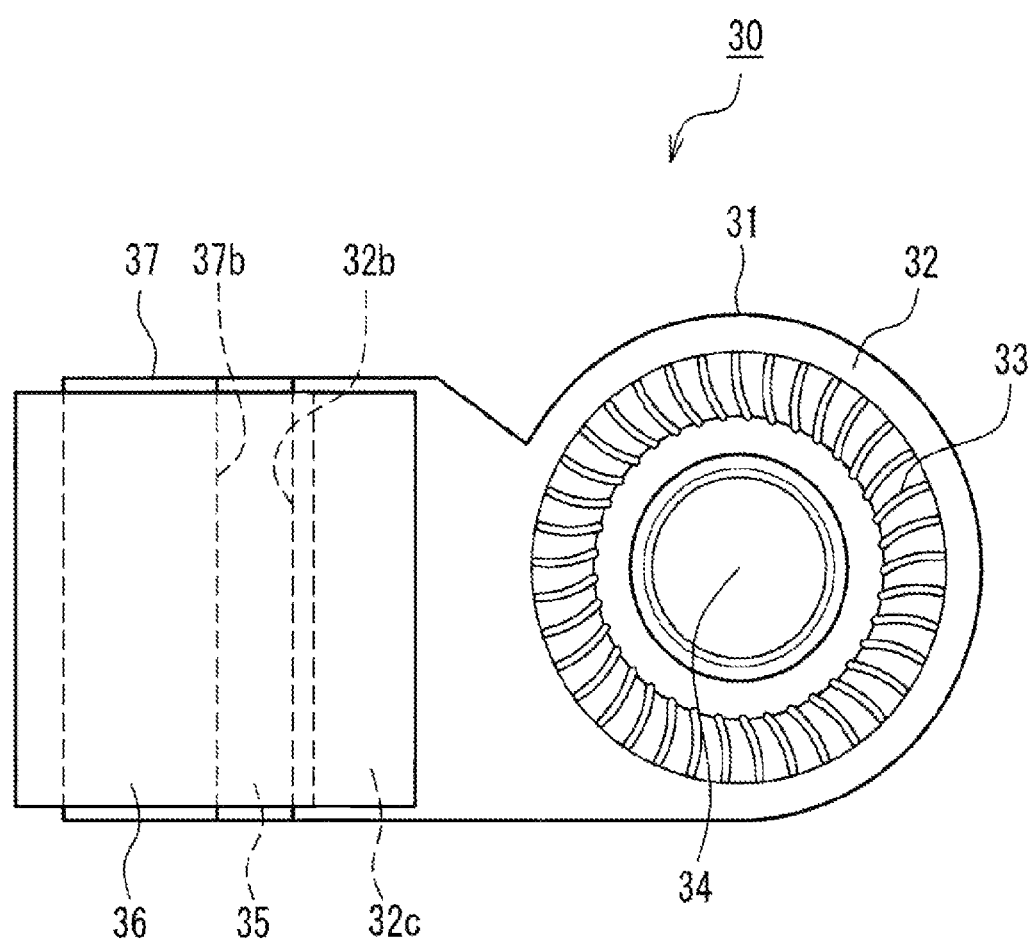
FIG. 5 is a schematic plan view of the structure of the heat-dissipating unit.

Next, a dust removal mechanism of the heat-dissipating unit will be described with reference to FIG. 2 to FIG. 5. FIG. 5 is a schematic plan view of a structure of the heat-dissipating unit 30.

As shown in FIG. 2 to FIG. 5, the heat-dissipating unit 30 does not have a structure in which the heat-dissipating component 37 is disposed in close contact with the air outlet 32*b* formed in the fan case 32 of the fan 31. A communicating path 35 is formed between the air outlet 32*b* of the fan 31 and the inflow surface 37*b* of the heat-dissipating component 37, for communicating the two. The bottom side of the communicating path 35 is open.

The fan case 32 has an opening 32*c* formed between the air outlet 32*b* and the fan main unit 33. One end of a duct 36 acting as an airflow path is connected to the opening 32*c*. The other end of the duct 36 is positioned on the heat-dissipating component 37. Namely, the duct 36 communicates the opening 32*c* with the heat-dissipating component 37.

The dust removal mechanism includes: the communicating path 35 that is provided between the air outlet 32*b* of the fan 31 and the inflow surface 37*b* of the heat-dissipating component 37 so as to communicate the two, and has at least its bottom side open; an opening 32*c* provided at the air outlet 32*b* of the fan 31 in the fan case 32 of the fan 31 and formed so as to be positioned between the air outlet 32*b* and the fan main unit 33; and the duct 36 acting as an airflow path that communicates the opening 32*c* with the heat-dissipating component 37.

By the dust removal mechanism having such a structure, in a state where the fan 31 is operating, air (cooling air) is supplied from the fan 31 through the duct 36 to the heat-dissipating component 37. Thus, dust on the inflow surface 37*b*, which is the end surface of the plurality of fins 37*a* of the heat-dissipating component 37 on the inflow side of the heat-dissipating component 37, is removed. As a result, a notebook computer 1 can be provided which has a built-in heat-dissipating unit 30 that make it possible to restrain increase in cost and increase in the weight, and enables the removal of dust on the heat-dissipating component 37 with a simplified structure.

The other end (the end portion on the heat-dissipating component 37 side) of the duct 36 is positioned on the discharge outlet surface of the heat-dissipating component 37. With this structure, air (cooling air) is supplied from the fan main unit 33 of the fan 31 through the duct 36 to the discharge outlet surface of the heat-dissipating component 37, and flow of air in a direction opposite to the direction in which air flows during normal usage is generated in the heat-dissipating component 37. Thus, dust on the inflow surface 37*b* of the heat-dissipating component 37 can be removed.

Further, the end portion of the duct 36 on the heat-dissipating component 37 side is formed, along a direction orthogonal to a direction in which air flows from the fan 31, so as to have a length that is almost equal to the transverse span of the heat-dissipating component 37. With this structure, air (cooling air) supplied through the duct 36 passes through the gaps among all the fins 37*a* of the heat-dissipating component 37. Therefore, dust on the entirety of the inflow surface 37*b* of the heat-dissipating component 37 can be easily removed.

Further, the opening 32*c* is formed on the top surface of the fan case 32, and the end portion of the duct 36 on the heat-dissipating component 37 side is positioned in the upper portion of the heat-dissipating component 37. With this structure, a duct 36 having a reduced length can be used to supply air (cooling air) from the fan main unit 33 of the fan 31 to the discharge outlet surface of the heat-dissipating component 37. Further, air (cooling air) is supplied from the upper portion of the discharge outlet surface of the heat-dissipating component 37 toward the bottom side of the communicating path 35, which is open, thereby enabling dust on the inflow surface 37*b* of the heat-dissipating component 37 to be removed.

Further, the duct 36 is formed stretching almost across the top surface of the fan case 32 and the entirety of the top surface of the heat-dissipating component 37. With this structure, the duct 36 is accommodated along the top surface of the fan case 32 and the top surface of the heat-dissipating component 37, and space for housing the duct 36 need not be additionally set aside, thereby restraining increase in cost.

[1-3. Dust Removal Method]

Figure 6:
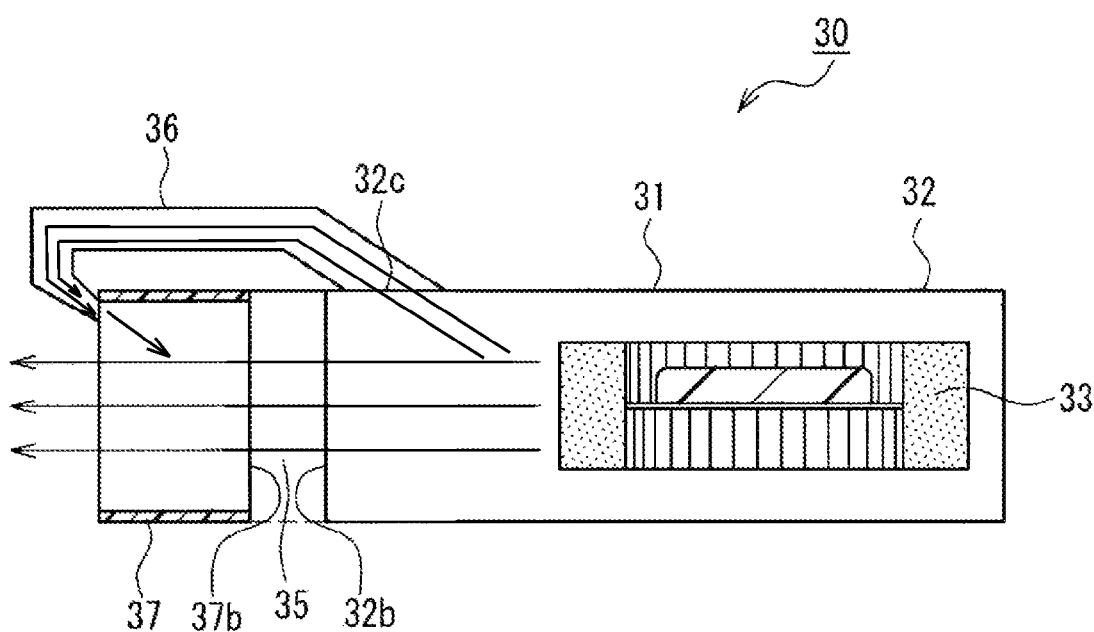
FIG. 6 is a schematic vertical cross-sectional view illustrating a method for removing dust on a heat-dissipating component of the heat-dissipating unit (with the duct being illustrated enlarged for ease of understanding)

Next, a method for removing dust on the heat-dissipating component 37 of the heat-dissipating unit 30 built into the notebook computer 1 will be described with reference to the schematic vertical cross-sectional view shown in FIG. 6. In FIG. 6, the duct is illustrated enlarged for ease of understanding.

In a state where the fan 31 is operating in order to release, from the heat-dissipating component 37, heat generated when the heat-emitting components such as the CPU 24 operates, the structure, which will be described below, is as shown in FIG. 6.

Air (cooling air) supplied from the fan main unit 33 of the fan 31 is directly released through the communicating path 35 and the heat-dissipating component 37 to the exterior of the casing together with heat generated when the heat-emitting components such as the CPU 24 operate.

In a case where dust on the inflow surface 37*b* of the heat-dissipating component 37 is removed, in a state where the fan 31 is operating, air (cooling air) is supplied from the fan main unit 33 of the fan 31 through the duct 36 to the discharge outlet surface of the heat-dissipating component 37, and flow of air in a direction opposite to the direction described above is generated in the heat-dissipating component 37. Thus, dust on the inflow surface 37*b*, which is the end surface of the plurality of fins 37*a* of the heat-dissipating component 37 on the inflow side of the heat-dissipating component 37, is removed. Dust having been removed from the heat-dissipating component 37 is discharged outside the communicating path 35 through the bottom side thereof where the communicating path 35 is open.

Figure 7:
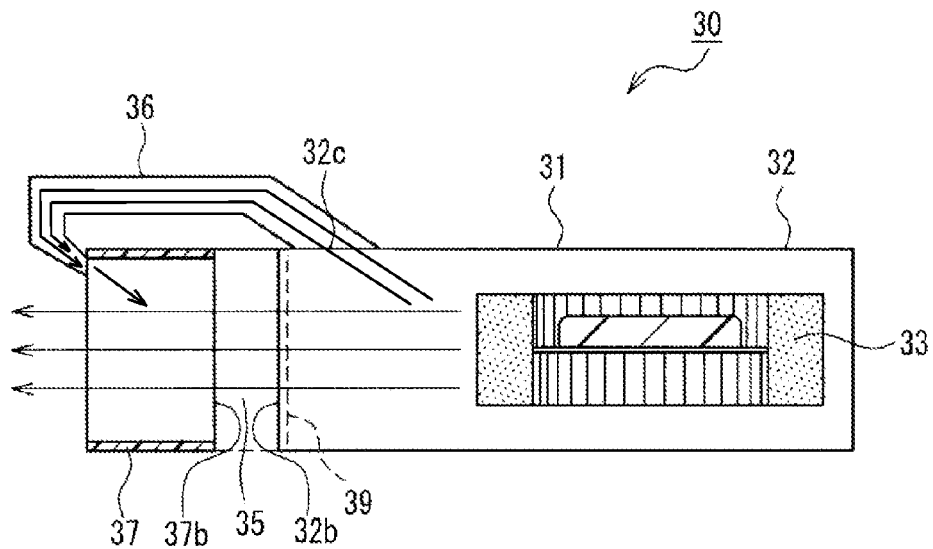
FIG. 7 is a schematic vertical cross-sectional view illustrating a method for removing dust on a heat-dissipating component of a heat-dissipating unit having another structure (with the duct being illustrated enlarged for ease of understanding)
Figure 7:
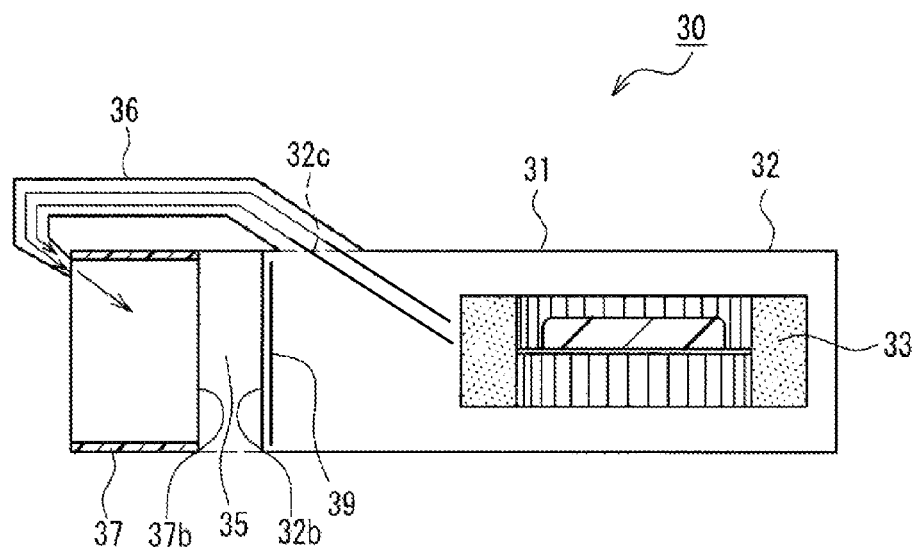

Further, as shown in FIG. 7, first shutter means 39 for switching flow of air (cooling air) supplied from the fan main unit 33 may be provided at the air outlet 32b of the fan 31. The outer-frame side portion of the first shutter means 39 is configured so as to be in close contact with the air outlet 32b, and, in a state where the first shutter means 39 is in a closed state, air (cooling air) supplied from the fan 31 is sealed in.

With this structure, the dust removal mechanism is structured so as to include: the communicating path 35 that is provided between the air outlet 32b of the fan 31 and the inflow surface 37b of the heat-dissipating component 37 so as to communicate the two, and has at least its bottom side open; the first shutter means 39, provided at the air outlet 32b of the fan 31, for opening and closing the air outlet 32b; the opening 32c formed, in the fan case 32 of the fan 31, between the air outlet 32b and the fan main unit 33; and the duct 36 that acts as an airflow path communicating the opening 32c with the heat-dissipating component 37.

With the dust removal mechanism having such a structure, in a state where the fan 31 is operating, the first shutter means 39 for opening and closing the air outlet 32b of the fan 31 is caused to be in a closed state, thereby supplying the entirety of the air (cooling air) from the fan 31 through the duct 36 to the heat-dissipating component 37. Thus, dust on the inflow surface 37b, which is the end surface of the plurality of fins 37a of the heat-dissipating component 37 on the inflow side of the heat-dissipating component 37, is removed. As a result, a notebook computer 1 can be provided which has a built-in heat-dissipating unit 30 that makes it possible to restrain increase in cost and increase in the weight, and enables the removal of dust on the heat-dissipating component 37 with a simplified structure.

Further, the end portion of the duct 36 on the heat-dissipating component 37 side is formed, along a direction orthogonal to a direction in which air flows from the fan 31, so as to have a length that is almost equal to the transverse span of the heat-dissipating component 37. With this structure, air (cooling air) supplied through the duct 36 passes through the gaps among all the fins 37a of the heat-dissipating component 37. Therefore, dust on the entirety of the inflow surface 37b of the heat-dissipating component 37 can be easily removed.

Further, the opening 32c is formed on the top surface of the fan case 32, and the end portion of the duct 36 on the heat-dissipating component 37 side is positioned in the upper portion of the heat-dissipating component 37. With this structure, the duct 36 having a reduced length can be used to supply air (cooling air) from the fan main unit 33 of the fan 31 to the discharge outlet surface of the heat-dissipating component 37. Further, air (cooling air) is supplied from the upper portion of the discharge outlet surface of the heat-dissipating component 37 toward the bottom side of the communicating path 35, which is open, thereby enabling the efficient removal of dust on the inflow surface 37b of the heat-dissipating component 37.

Further, the duct 36 is formed stretching almost across the top surface of the fan case 32 and the entirety of the top surface of the heat-dissipating component 37. With this structure, the duct 36 is accommodated along the top surface of the fan case 32 and the top surface of the heat-dissipating component 37, and space for housing the duct 36 need not be additionally set aside, thereby restraining increase in cost.

In a state where the fan 31 is operating in order to release, from the heat-dissipating component 37, heat generated when heat-emitting components, such as the CPU 24, operate, the first shutter means 39 for opening and closing the air outlet 32b of the fan 31 is in an opened state as shown in FIG. 7(a) (the first shutter means 39 in the opened state is represented by a dashed line).

Therefore, although a portion of air (cooling air) supplied from the fan main unit 33 of the fan 31 flows into the duct 36, most of the air is released through the communicating path 35 and the heat-dissipating component 37 to the exterior of the casing, together with heat generated when the heat-emitting components such as the CPU 24 operate. Therefore, air (cooling air) supplied from the fan 31 through the communicating path 35 efficiently cools the plurality of fins 37a to which heat is transferred from the CPU 24.

When dust on the inflow surface 37b of the heat-dissipating component 37 is removed, in a state where the fan 31 is operating, the first shutter means 39 for opening and closing the air outlet 32b of the fan 31 is caused to be in a closed state as shown in FIG. 7(b) (the first shutter means 39 in the closed state is represented by a solid line).

Thus, air (cooling air) is supplied from the fan main unit 33 of the fan 31 through the duct 36 to the discharge outlet surface of the heat-dissipating component 37, and flow of air is generated in a direction opposite to the direction in which air flows during normal usage for cooling the plurality of fins 37a in the heat-dissipating component 37. Consequently, dust on the inflow surface 37b, which is the end surface of the plurality of fins 37a of the heat-dissipating component 37 on the inflow side of the heat-dissipating component 37, is removed. Dust having been removed from the heat-dissipating component 37 is discharged outside the communicating path 35 through the bottom side thereof where the communicating path 35 is open.

Figure 8:
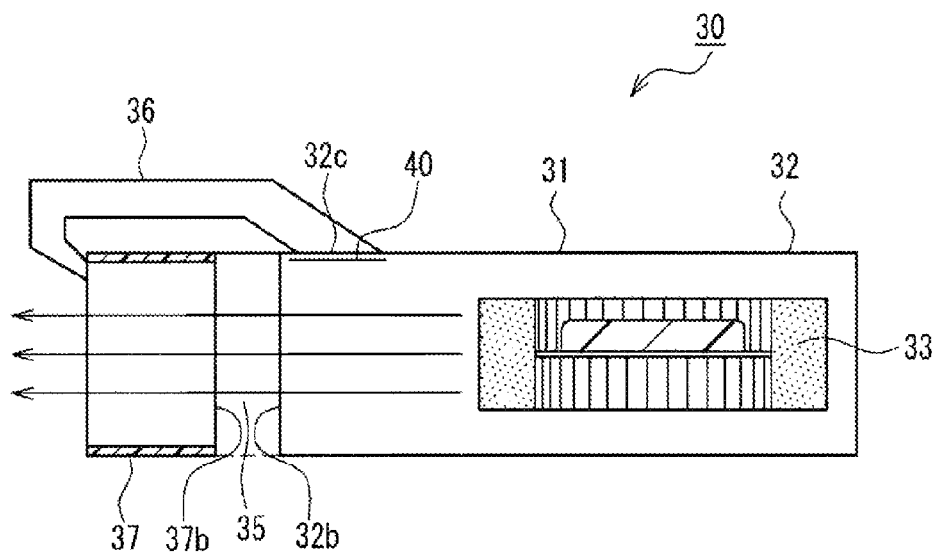
FIG. 8 is a schematic vertical cross-sectional view illustrating a method for removing dust on a heat-dissipating component of a heat-dissipating unit having still another structure (with the duct being illustrated enlarged for ease of understanding)
Figure 8:
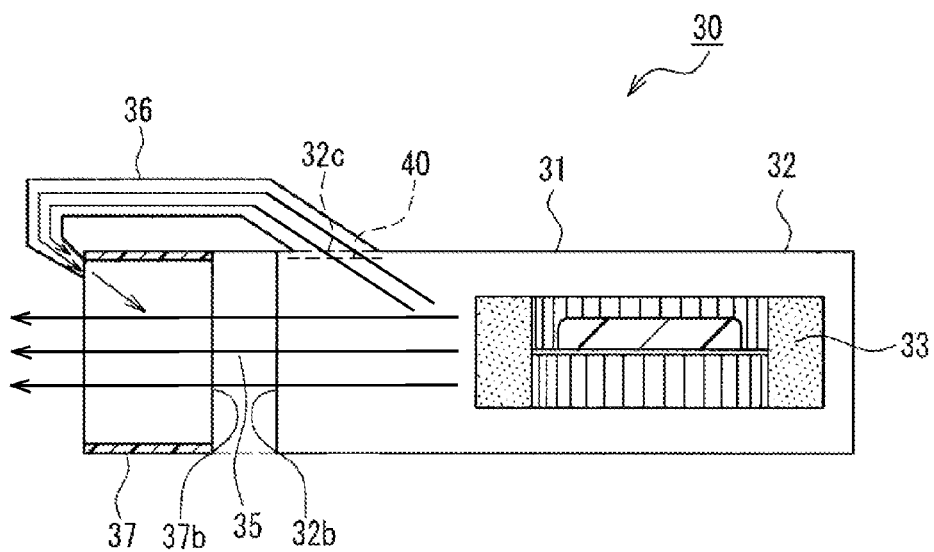

Further, as shown in FIG. 8, at the opening 32c formed on the top surface of the fan case 32, second shutter means 40 for opening and closing the opening 32c may be provided. The outer-frame side portion of the second shutter means 40 is configured so as to be in close contact with the opening 32c, and, in a state where the second shutter means 40 is in a closed state, air (cooling air) supplied from the fan 31 is sealed in.

As described above, the dust removal mechanism is structured so as to include: the communicating path 35 that is provided between the air outlet 32b of the fan 31 and the inflow surface 37b of the heat-dissipating component 37 so as to communicate the two, and has at least its bottom side open; the opening 32c formed, in the fan case 32 of the fan 31, between the air outlet 32b and the fan main unit 33; the duct 36 that acts as an airflow path communicating the opening 32c with the heat-dissipating component 37; and the second shutter means 40 provided at the opening 32c for opening and closing the opening 32c.

With the dust removal mechanism having such a structure, in a state where the fan 31 is operating, the second shutter means 40 for opening and closing the opening 32c formed in the fan case 32, is caused to be in an opened state, thereby supplying air (cooling air) from the fan 31 through the duct 36 to the heat-dissipating component 37. Thus, dust on the inflow surface 37b, which is the end surface of the plurality of fins 37a of the heat-dissipating component 37 on the inflow side of the heat-dissipating component 37, is removed. As a result, a notebook computer 1 can be provided which has a built-in heat-dissipating unit 30 that makes it possible to restrain increase in cost and increase in the weight, and enables the removal of dust on the heat-dissipating component 37 with a simplified structure.

The other end (the end portion on the heat-dissipating component 37 side) of the duct 36 is positioned on the discharge outlet surface of the heat-dissipating component 37.

With this structure, air (cooling air) is supplied from the fan main unit 33 of the fan 31 through the duct 36 to the discharge outlet surface of the heat-dissipating component 37, and flow of air in a direction opposite to the direction in which air flows during normal usage is generated in the heat-dissipating component 37. Thus, dust on the inflow surface 37b of the heat-dissipating component 37 can be efficiently removed.

Further, the end portion of the duct 36 on the heat-dissipating component 37 side is formed, along a direction orthogonal to a direction in which air flows from the fan 31, so as to have a length that is almost equal to the transverse span of the heat-dissipating component 37. With this structure, air (cooling air) supplied through the duct 36 passes through the gaps among all the fins 37a of the heat-dissipating component 37. Therefore, dust on the entirety of the inflow surface 37b of the heat-dissipating component 37 can be easily removed.

Further, the opening 32c is formed on the top surface of the fan case 32, and the end portion of the duct 36 on the heat-dissipating component 37 side is positioned in the upper portion of the heat-dissipating component 37. With this structure, a duct 36 having a reduced length can be used to supply air (cooling air) from the fan main unit 33 of the fan 31 to the discharge outlet surface of the heat-dissipating component 37. Further, air (cooling air) is supplied from the upper portion of the discharge outlet surface of the heat-dissipating component 37 toward the bottom side of the communicating path 35, which is open, thereby enabling efficient removal of dust on the inflow surface 37b of the heat-dissipating component 37.

Further, the duct 36 is formed stretching almost across the top surface of the fan case 32 and the entirety of the top surface of the heat-dissipating component 37. With this structure, the duct 36 is accommodated along the top surface of the fan case 32 and the top surface of the heat-dissipating component 37, and space for housing the duct 36 need not be additionally set aside, thereby restraining increase in cost.

A method for removing dust on the heat-dissipating component 37 of the heat-dissipating unit 30 having this structure will be described with reference to the schematic vertical cross-sectional view shown in FIG. 8. In FIG. 8, the duct is illustrated enlarged for ease of understanding.

In a state where the fan 31 is operating in order to release, from the heat-dissipating component 37, heat which is generated when the heat-emitting components such as the CPU 24 operates, the second shutter means 40 for opening and closing the opening 32c formed on the top surface of the fan case 32 is in the closed state as shown in FIG. 8(a) (the second shutter means 40 in the closed state is represented by a solid line).

Therefore, air (cooling air) supplied from the fan main unit 33 of the fan 31 is directly released through the communicating path 35 and the heat-dissipating component 37 to the exterior of the casing together with heat which is generated when the heat-emitting components such as the CPU 24 operate.

In a case where dust on the inflow surface 37b of the heat-dissipating component 37 is removed, in a state where the fan 31 is operating, the second shutter means 40 for opening and closing the opening 32c formed on the top surface of the fan case 32 is caused to be in the opened state, as shown in FIG. 8(b) (the second shutter means 40 in the opened state is represented by a dashed line).

Thus, air (cooling air) is supplied from the fan main unit 33 of the fan 31 through the duct 36 to the discharge outlet surface of the heat-dissipating component 37, and flow of air is generated in a direction opposite to the direction in which air flows during normal usage for cooling the plurality of fins 37a in the heat-dissipating component 37. Consequently, dust on the inflow surface 37b, which is the end surface of the plurality of fins 37a of the heat-dissipating component 37 on the inflow side of the heat-dissipating component 37, is removed. Dust having been removed from the heat-dissipating component 37 is discharged outside the communicating path 35 through the bottom side thereof where the communicating path 35 is open.

The first shutter means 39 and the second shutter means 40 may be of any of various opening-and-closing types, such as a sliding-door opening/shutting type, a window-shade opening/closing type, a hinge-door opening/shutting type, a venetian-blind opening/shutting type, or the like. Further, the first shutter means 39 and the second shutter means 40 can be operated by, for example, an opening-and-closing switch being operated.

[2-1. Structure of Heat-dissipating Unit]

Figure 9:
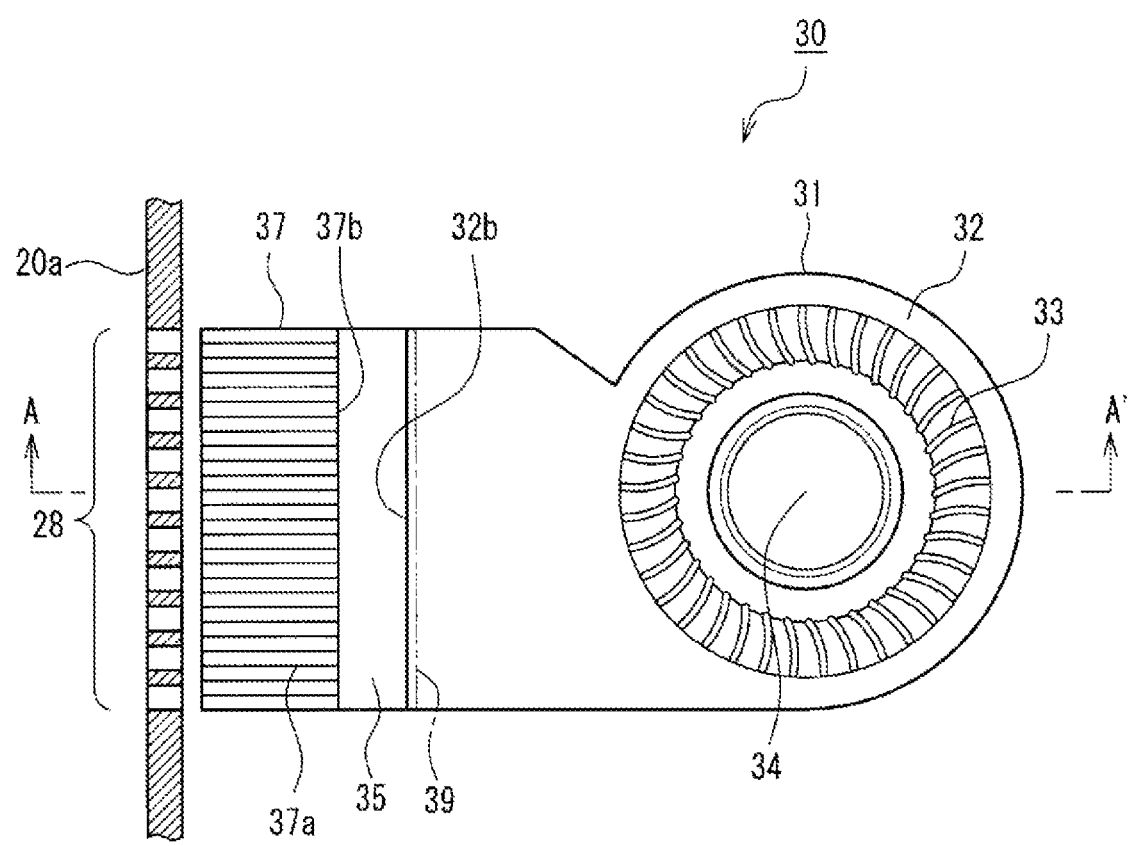
FIG. 9 is a schematic horizontal cross-sectional view of another structure of the heat-dissipating unit.
Figure 10:
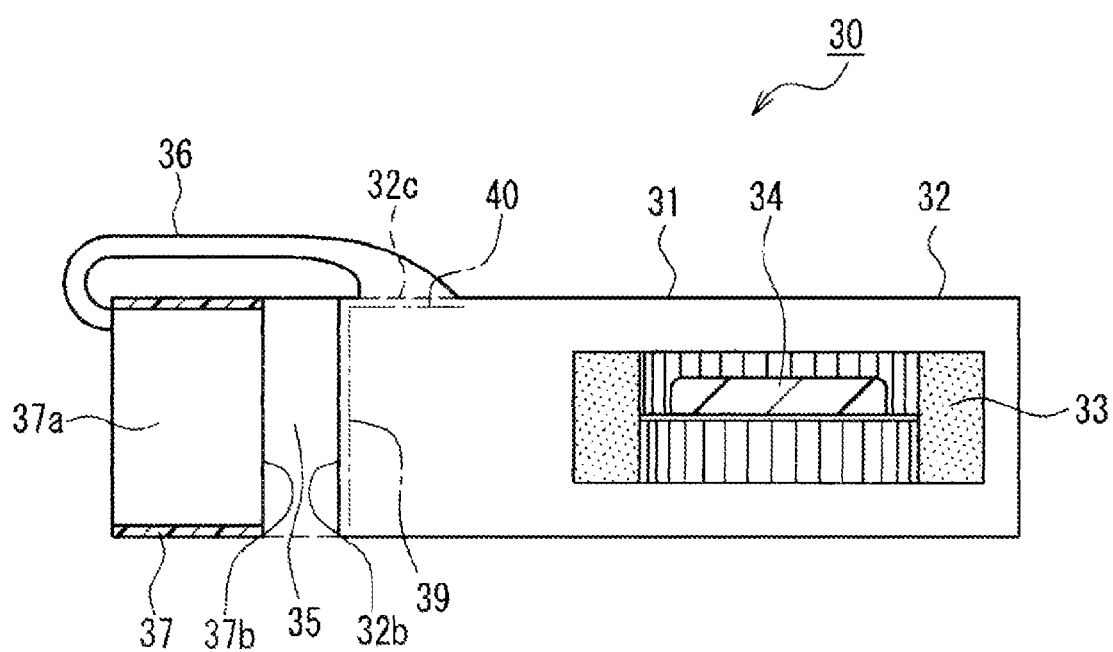
FIG. 10 is a schematic cross-sectional view (schematic vertical cross-sectional view) taken along the line A-A' shown in FIG. 9 (with casing not illustrated)

Next, a structure of the heat-dissipating unit 30 built into the notebook computer 1 will be described with reference to FIG. 2, FIG. 9, and FIG. 10. FIG. 2 is a schematic exploded perspective view illustrating main components of the heat-dissipating unit 30. FIG. 9 is a schematic horizontal cross-sectional view of the structure of the heat-dissipating unit 30. FIG. 10 is a schematic cross-sectional view (schematic vertical cross-sectional view) taken along the line A-A' shown in FIG. 9. FIG. 2 illustrates, in an enlarged manner, only the central processing unit (CPU) 24 and its environs, the CPU 24 being representative of a heat-emitting component whose temperature during operation goes highest among the various electronic components disposed in the main unit 20, and the heat-dissipating unit 30, for releasing heat emitted from the CPU 24 to the exterior of a casing 20a forming an exterior case of the main unit 20, and the unit 30 environs. Further, in FIG. 9, the casing 20a is not illustrated.

As shown in FIG. 2, the CPU 24 is mounted and disposed on the circuit substrate 23, below the keyboard 21 disposed on the surface, inside the main unit 20 of the notebook computer 1. On the top surface of the CPU 24, the heat receiving section 25 is disposed for receiving heat generated while the CPU 24 is operating. The heat receiving section 25 is mechanically and thermally fixed to the CPU 24 that is a heat source, so as to be pressed against the CPU 24, by means of the fixing component 26 having spring-like legs.

To the heat receiving section 25, one end of the heat pipe 27 made of, for example, copper is connected for transferring the received heat to the heat-dissipating unit 30, and the other end of the heat pipe 27 is mechanically and thermally connected to the top surface of the heat-dissipating component 37 described below. The heat pipe 27 is formed of, for example, copper in a tubular shape, and has sealed therein a heat conductive medium, such as an alternative for chlorofluorocarbon, having a high heat conductivity, thereby efficiently transferring, to the heat-dissipating component 37, heat received from the CPU 24 by the heat receiving section 25.

The heat-dissipating unit 30 includes: the heat-dissipating component 37 having the plurality of fins 37a to which heat is transferred from the CPU 24; and a fan 31 for supplying air (cooling air) to the heat-dissipating component 37. As described above, the other end of the heat pipe 27 is mechanically and thermally connected to the top surface of the heat-dissipating component 37. Heat exchange between air (cooling air) supplied from the fan 31, and heat transferred from the CPU 24 to the heat-dissipating component 37 is made to occur, and the heated air is released to the exterior of the casing 20a. The heated air is released to the exterior of the casing 20a through the discharge outlet 28 (see FIG. 1, and FIG. 9 referred to below) that is formed as slits in the casing 20a so as to correspond to the shape of the heat-dissipating component 37. Further, air (cooling air) to be supplied from the fan 31 to the heat-dissipating component 37 is drawn in through the air inlet 32a formed in the top surface of the fan case 32.

As shown in FIG. 2, FIG. 9, and FIG. 10, in the fan 31, the fan main unit 33 accommodated in the fan case 32 spins about the rotation shaft 34 as its axial center, to draw in ambient air through the air inlet 32a which is formed in the top surface of the fan case 32. Air having been drawn in through the air inlet 32a is introduced into the heat-dissipating component 37 through the inflow surface 37b of the heat-dissipating component 37, which is opposed to and in close association with the air outlet 32b. Air having been introduced into the heat-dissipating component 37 passes, as cooling air, through gaps where the plurality of fins 37a oppose each other, and is discharged through a discharge outlet surface of the heat-dissipating component 37. The shape of the entirety of the fan 31, the shape of the air inlet 32a, the shape of the fan main unit 33 that spins about the rotation shaft 34, and the like as shown in FIG. 2, FIG. 9, and FIG. 10 are exemplary ones. The fan 31 may be any of various types of cooling fans which can draw in ambient air through an air inlet, and discharge air through an air outlet, as conventionally used.

The heat-dissipating component 37 is made of a metal having a high heat conductivity such as copper, for example, and has a plurality of fins 37a that are formed as a plurality of thin-plate-like components so as to extend parallel to a direction in which cooling air discharged from the fan 31 flows toward the exterior of the casing 20a. The cooling air having passed through the gaps among the fins 37a of the heat-dissipating component 37 is discharged outside the casing 20a through the discharge outlet 28 that is formed as slits in the casing 20a so as to correspond to the shape of the heat-dissipating component 37. The bottom surface of the heat-dissipating component 37 is flush with the bottom surface of the air outlet 32b of the fan 31, and the size of the heat-dissipating component 37 is such that, particularly, the width and the height of the heat-dissipating component 37 as viewed from the fan 31 side are equal to the width and the height of the air outlet 32b of the fan 31.

[2-2. Dust Removal Mechanism]

Figure 11:
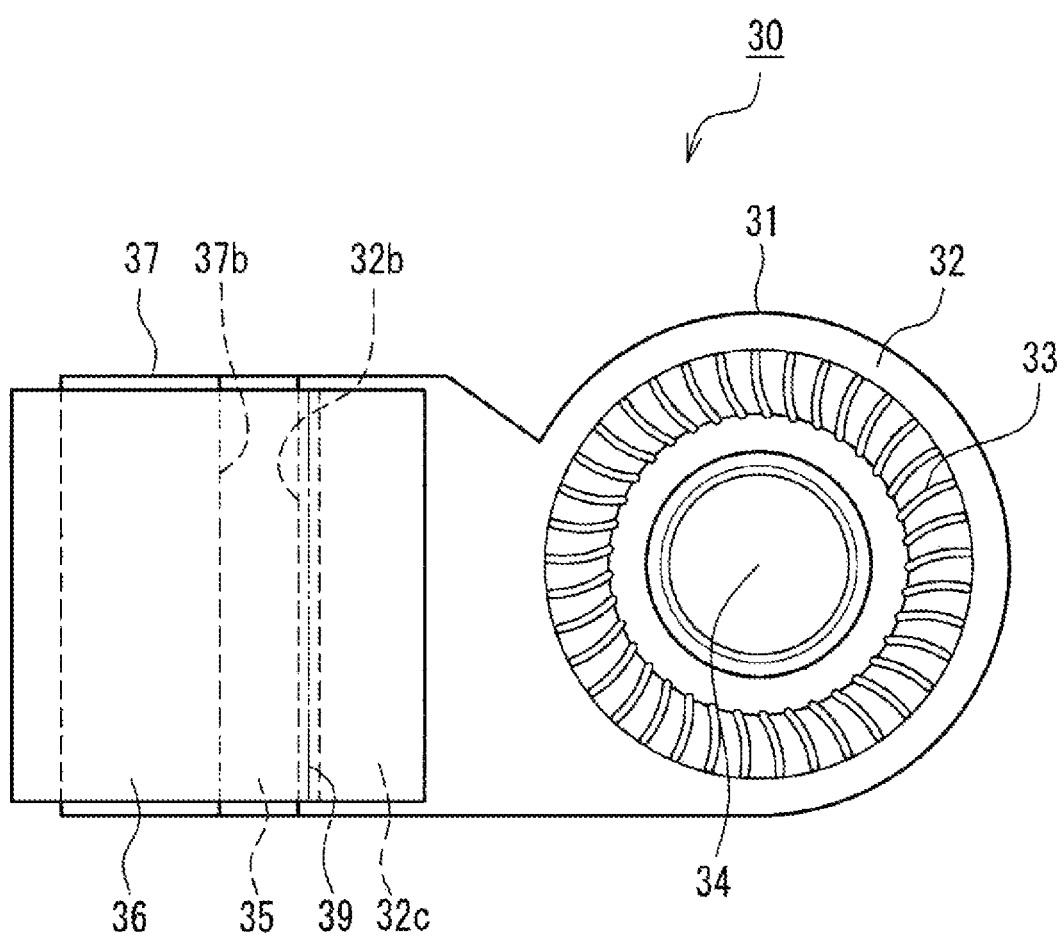
FIG. 11 is a schematic plan view of the structure of the heat-dissipating unit.

Next, a dust removal mechanism of the heat-dissipating unit will be described with reference to FIG. 2, and FIG. 9 to FIG. 11. FIG. 11 is a schematic plan view of a structure of the heat-dissipating unit 30.

As shown in FIG. 2, and FIG. 9 to FIG. 11, the heat-dissipating unit 30 does not have a structure in which the heat-dissipating component 37 is disposed in close contact with the air outlet 32b formed in the fan case 32 of the fan 31. The communicating path 35 is formed between the air outlet 32b of the fan 31 and the inflow surface 37b of the heat-dissipating component 37, for communicating the two. The bottom side of the communicating path 35 is open.

The fan case 32 has the opening 32c formed between the air outlet 32b and the fan main unit 33. One end of the duct 36 acting as an airflow path is connected to the opening 32c. The other end of the duct 36 is positioned at the heat-dissipating component 37. Namely, the duct 36 communicates the opening 32c with the heat-dissipating component 37.

The first shutter means 39 for opening and closing the air outlet 32b is provided at the air outlet 32b of the fan 31. Each outer side of the first shutter means 39 is formed in close contact with the air outlet 32b, and, in a state where the first shutter means 39 is in the closed state, air (cooling air) supplied from the fan 31 is sealed in.

Further, at the opening 32c formed on the top surface of the fan case 32, the second shutter means 40 for opening and closing the opening 32c is provided. The outer-frame side portion of the second shutter means 40 is configured so as to be in close contact with the opening 32c, and, in a state where the second shutter means 40 is in a closed state, air (cooling air) supplied from the fan 31 is sealed in.

The first shutter means 39 and the second shutter means 40 may be of any of various opening-and-closing types, such as a sliding-door opening/shutting type, a window-shade opening/closing type, a hinge-door opening/shutting type, a venetian-blind opening/shutting type, or the like. Further, the first shutter means 39 and the second shutter means 40 can be operated by, for example, an opening-and-closing switch being operated.

As described above, the dust removal mechanism is structured so as to include: the communicating path 35 that is provided between the air outlet 32b of the fan 31 and the inflow surface 37b of the heat-dissipating component 37 so as to communicate the two, and has at least its bottom side open; the first shutter means 39, provided at the air outlet 32b of the fan 31, for opening and closing the air outlet 32b; the opening 32c formed, in the fan case 32 of the fan 31, between the air outlet 32b and the fan main unit 33; the duct 36 that acts as an airflow path communicating the opening 32c with the heat-dissipating component 37; and the second shutter means 40 provided at the opening 32c for opening and closing the opening 32c.

With the dust removal mechanism having such a structure, in a state where the fan 31 is operating, the first shutter means 39 for opening and closing the air outlet 32b of the fan 31 is caused to be in the closed state, and the second shutter means 40 for opening and closing the opening 32c formed in the fan case 32 is caused to be in the opened state, thereby supplying air (cooling air) from the fan 31 through the duct 36 to the heat-dissipating component 37. Thus, dust on the inflow surface 37b, which is the end surface of the plurality of fins 37a of the heat-dissipating component 37 on the inflow side of the heat-dissipating component 37, is removed. As a result, a notebook computer 1 can be provided which has a built-in heat-dissipating unit 30 that makes it possible to restrain increase in cost and increase in the weight, and enables the removal of dust on the heat-dissipating component 37 with a simplified structure.

The other end (the end portion on the heat-dissipating component 37 side) of the duct 36 is positioned on the discharge outlet surface of the heat-dissipating component 37. With this structure, air (cooling air) is supplied from the fan main unit 33 of the fan 31 through the duct 36 to the discharge outlet surface of the heat-dissipating component 37, and flow of air in a direction opposite to a direction in which air flows during a normal usage is generated in the heat-dissipating component 37. Thus, dust on the inflow surface 37b of the heat-dissipating component 37 can be efficiently removed.

Further, the end portion of the duct 36 on the heat-dissipating component 37 side is formed, along a direction orthogonal to a direction in which air flows from the fan 31, so as to have a length that is almost equal to the transverse span of the heat-dissipating component 37. With this structure, air (cooling air) supplied through the duct 36 passes through the gaps among all the fins 37a of the heat-dissipating component 37. Therefore, dust on the entirety of the inflow surface 37b of the heat-dissipating component 37 can be easily removed.

Further, the opening 32c is formed on the top surface of the fan case 32, and the end portion of the duct 36 on the heat-dissipating component 37 side is positioned in the upper portion of the heat-dissipating component 37. With this structure, the duct 36 having a reduced length can be used to supply air (cooling air) from the fan main unit 33 of the fan 31 to the discharge outlet surface of the heat-dissipating component 37. Further, air (cooling air) is supplied from the upper portion of the discharge outlet surface of the heat-dissipating component 37 toward the bottom side of the communicating path 35, which is open, thereby enabling efficient removal of dust on the inflow surface 37b of the heat-dissipating component 37.

Further, the duct 36 is formed stretching almost across the top surface of the fan case 32 and the entirety of the top surface of the heat-dissipating component 37. With this structure, the duct 36 is accommodated along the top surface of the fan case 32 and the top surface of the heat-dissipating component 37, and space for housing the duct 36 need not be additionally set aside, thereby restraining increase in cost.

[2-3. Dust Removal Method]

Figure 12:
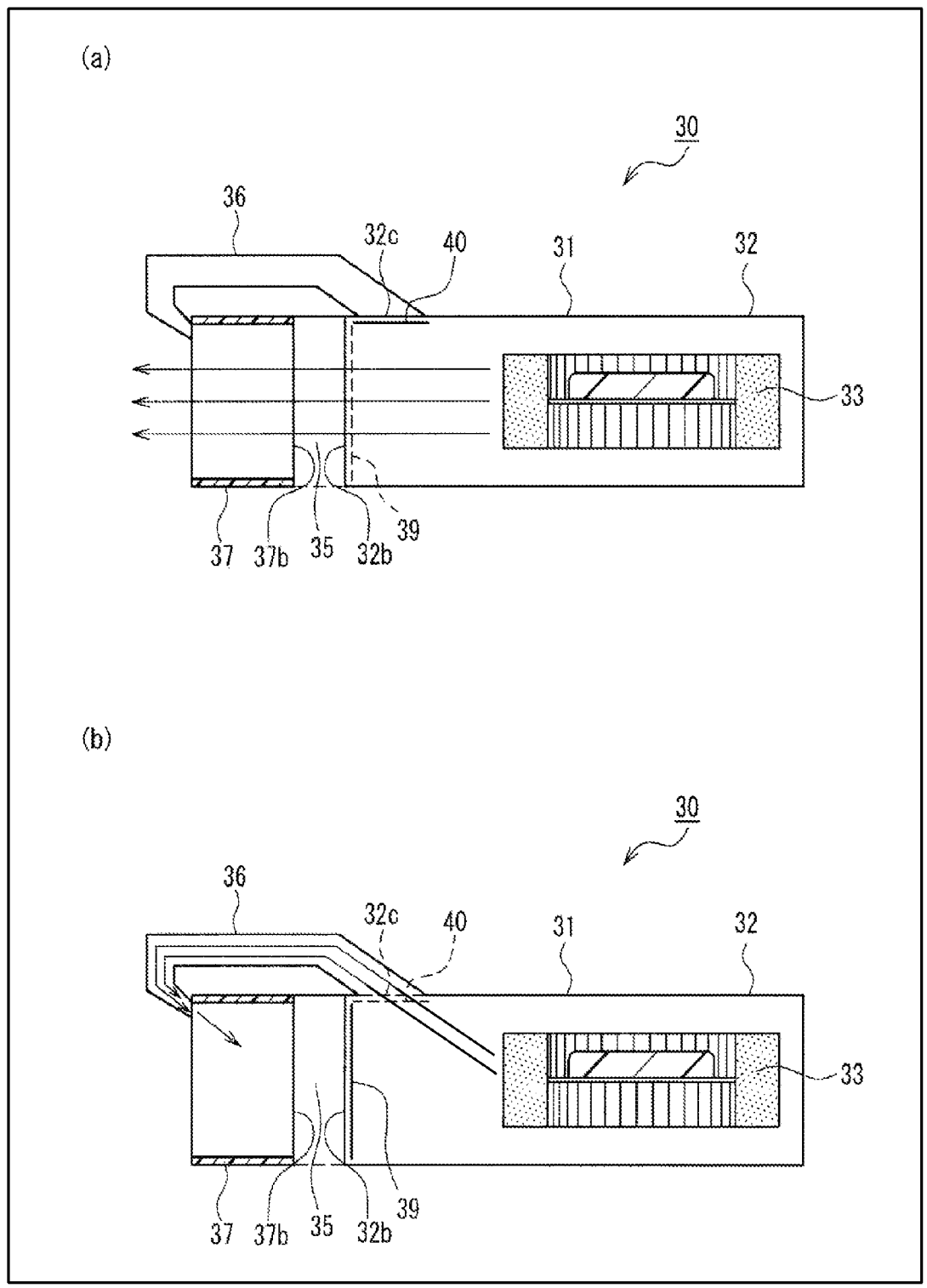
FIG. 12 is a schematic vertical cross-sectional view illustrating a method for removing dust on a heat-dissipating component of the heat-dissipating unit (with duct being illustrated enlarged for ease of understanding)

Next, a method for removing dust on the heat-dissipating component 37 of the heat-dissipating unit 30 built into the notebook computer 1 will be described with reference to the schematic vertical cross-sectional view shown in FIG. 12. In FIG. 12, the duct 36 is illustrated enlarged for ease of understanding.

In a state where the fan 31 is operating in order to release, from the heat-dissipating component 37, heat which is generated when the heat-emitting components such as the CPU 24 operate, as shown in FIG. 12(a), the first shutter means 39 for opening and closing the air outlet 32b of the fan 31 is in the opened state (the first shutter means 39 in the opened state is represented by a dashed line), and the second shutter means 40 for opening and closing the opening 32c formed on the top surface of the fan case 32 is in the closed state (the second shutter means 40 in the closed state is represented by a solid line).

Therefore, air (cooling air) supplied from the fan main unit 33 of the fan 31 is directly released through the communicating path 35 and the heat-dissipating component 37 to the exterior of the casing together with heat which is generated when the heat-emitting components such as the CPU 24 operate.

When dust on the inflow surface 37b of the heat-dissipating component 37 is removed, in a state where the fan 31 is operating, the first shutter means 39 for opening and closing the air outlet 32b of the fan 31 is caused to be in a closed state (the first shutter means 39 in the closed state is represented by a solid line), and the second shutter means 40 for opening and closing the opening 32c formed on the top surface of the fan case 32 is caused to be in the opened state (the second shutter means 40 in the opened state is represented by a dashed line), as shown in FIG. 12(b).

Thus, air (cooling air) is supplied from the fan main unit 33 of the fan 31 through the duct 36 to the discharge outlet surface of the heat-dissipating component 37, and flow of air in a direction opposite to a direction in which air flows during a normal usage is generated in the heat-dissipating component 37. Consequently, dust on the inflow surface 37b, which is the end surface of the plurality of fins 37a of the heat-dissipating component 37 on the inflow side of the heat-dissipating component 37, is removed. Dust having been removed from the heat-dissipating component 37 is discharged outside the communicating path 35 through the bottom side thereof where the communicating path 35 is open.

Figure 13:
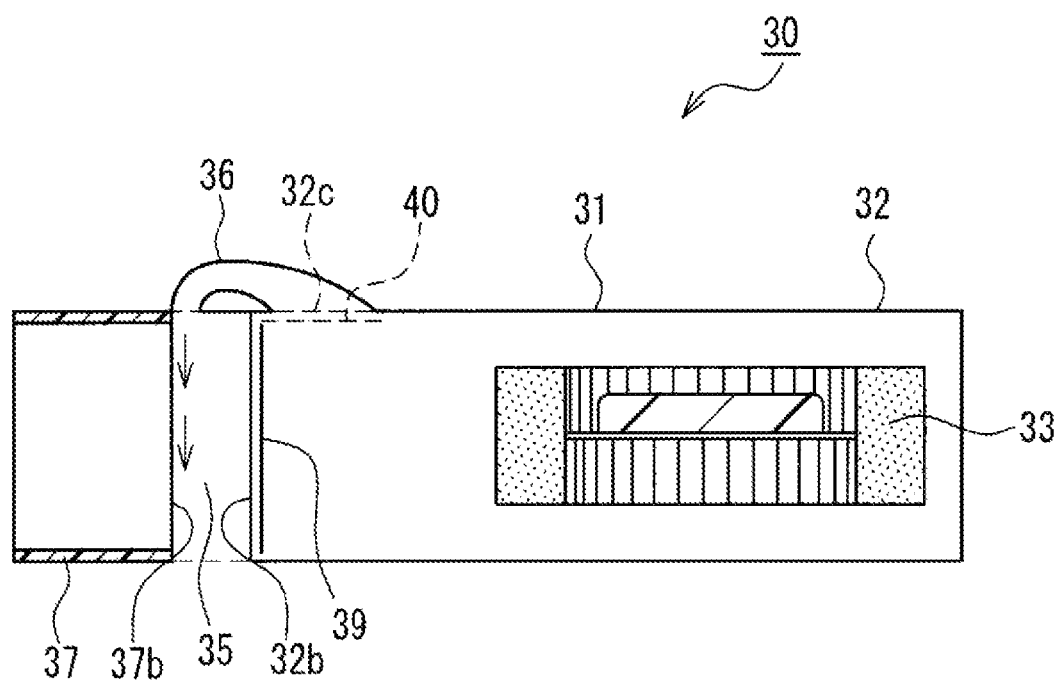
FIG. 13 is a schematic vertical cross-sectional view of a structure of a heat-dissipating unit having different configuration.
Figure 14:
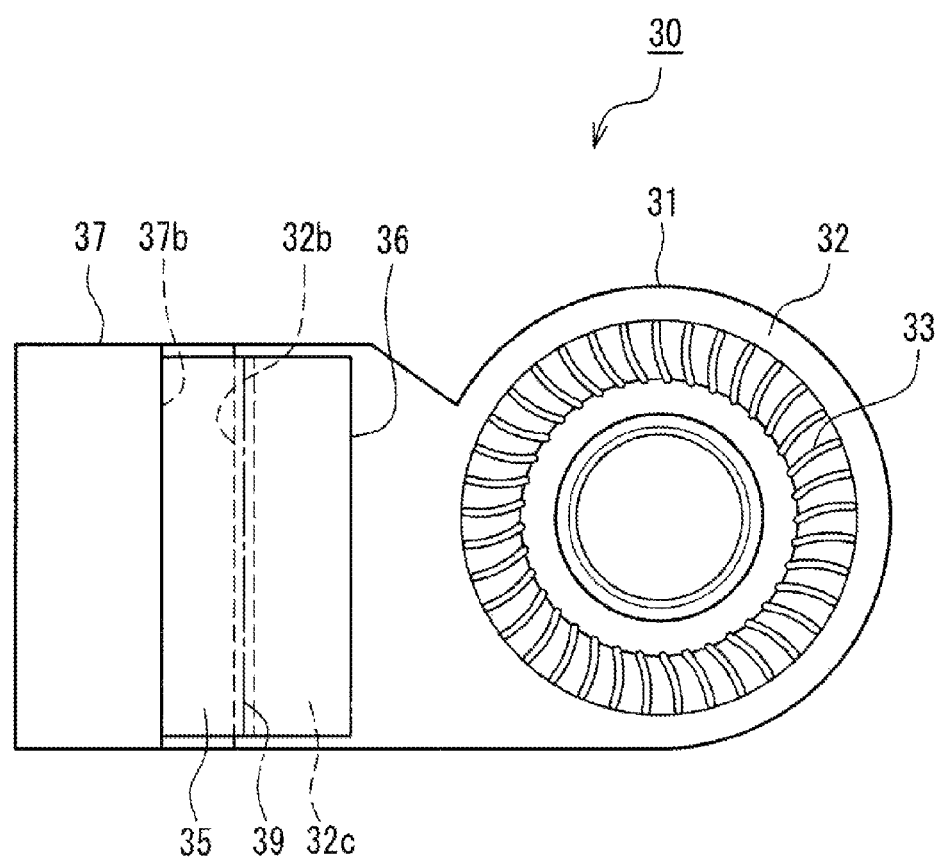
FIG. 14 is a schematic plan view of the structure of the FIG. 13 heat-dissipating unit.
Figure 15:
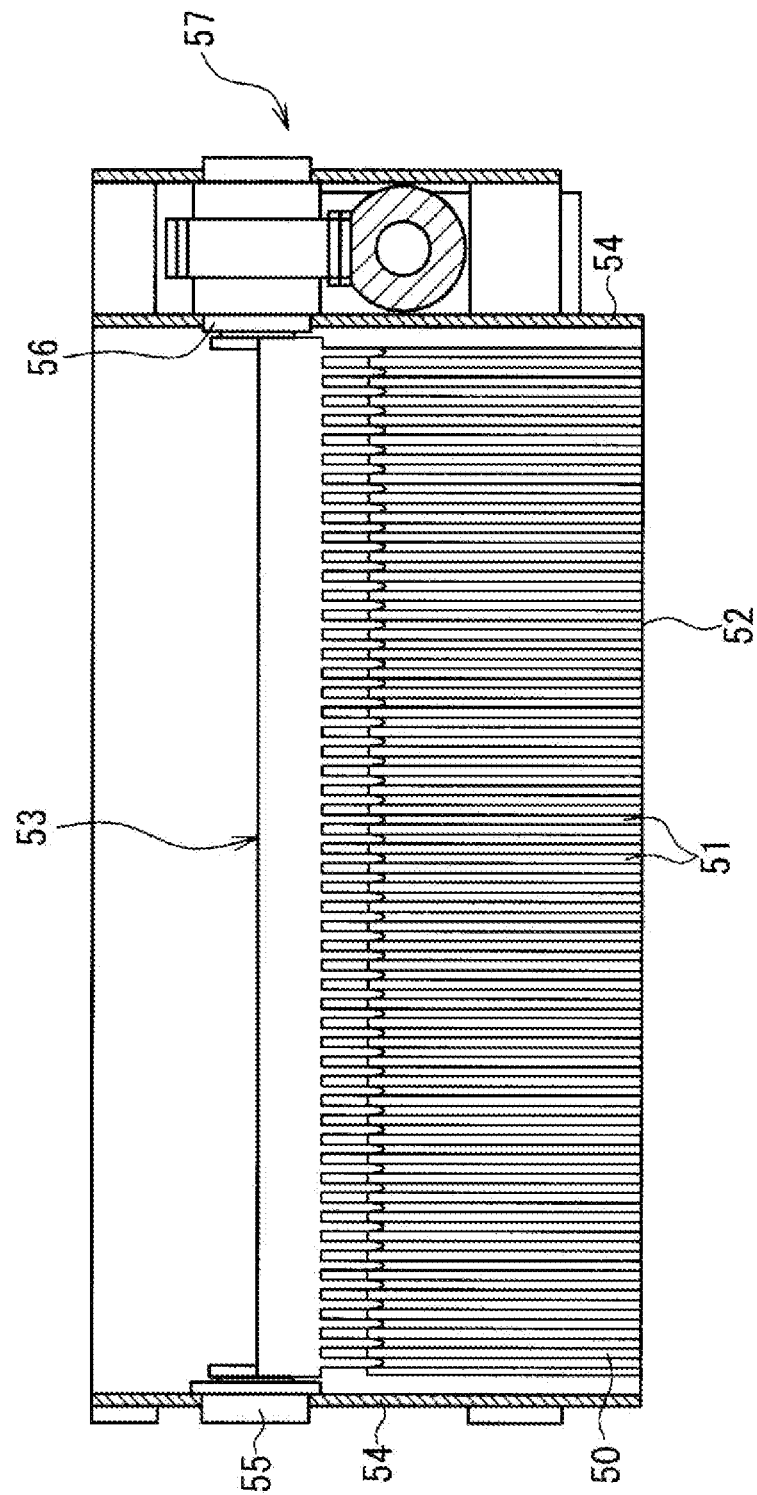
FIG. 15 is a schematic horizontal cross-sectional view of structure of a conventional heat-dissipating unit.

In the embodiment described above, the end portion of the duct 36 on the heat-dissipating component 37 side is positioned on the discharge outlet surface of the heat-dissipating component 37. However, the present disclosure is not limited to such a structure. For example, as shown in FIG. 13 and FIG. 14, the end portion of the duct 36 on the heat-dissipating component 37 side may be positioned on the inflow surface 37b of the heat-dissipating component 37. With this structure, in a state where the fan 31 is operating, when the first shutter means 39 for opening and closing the air outlet 32b of the fan 31 is caused to be in the closed state (the first shutter means 39 in the closed state is represented by a solid line in FIG. 13), and the second shutter means 40 for opening and closing the opening 32c formed on the top surface of the fan case 32 is caused to be in the opened state (the second shutter means 40 in the opened state is represented by a dashed line in FIG. 13), air (cooling air) is supplied from the fan main unit 33 of the fan 31 through the duct 36 to the inflow surface 37b of the heat-dissipating component 37, and air (cooling air) can be directly blown onto dust on the inflow surface 37b which is the end surface of the plurality of fins 37a of the heat-dissipating component 37 on the inflow side of the heat-dissipating component 37, to remove the dust.

Further, also in this case, the end portion of the duct 36 on the heat-dissipating component 37 side is formed, along the direction orthogonal to the direction in which air flows from the fan 31, so as to have a length that is almost equal to the transverse span of the heat-dissipating component 37. With this structure, air (cooling air) supplied through the duct 36 is blown onto the inflow surface 37b of the heat-dissipating component 37 across the full width thereof. Therefore, dust on the entirety of the inflow surface 37b of the heat-dissipating component 37 can be easily removed.

Further, also in this case, the opening 32c can be formed on the top surface of the fan case 32, and the end portion of the duct 36 on the heat-dissipating component 37 side can be positioned in the upper portion of the heat-dissipating component 37. With this structure, the duct 36 having a reduced length can be used to supply air (cooling air) from the fan main unit 33 of the fan 31 to the inflow surface 37b of the heat-dissipating component 37. Further, air (cooling air) is supplied from the upper portion of the inflow surface 37b of the heat-dissipating component 37 toward the bottom side of the communicating path 35, which is open, thereby enabling efficient removal of dust on the inflow surface 37b of the heat-dissipating component 37.

Further, in this case, the duct 36 can be formed stretching almost across the top surface of the fan case 32 and the entirety of the top surface of the communicating path 35. With this structure, the duct 36 is accommodated along the top surface of the fan case 32 and the top surface of the communicating path 35, and space for housing the duct 36 need not be additionally set aside, thereby restraining an increase in cost.

Further, the opening 32c may not be formed on the top surface of the fan case 32. The opening 32c may be formed on one of the bottom surface, the left side surface, or the right side surface of the fan case 32. However, as described above, in the structure in which the end portion of the duct 36 on the heat-dissipating component 37 side is positioned in the upper portion of the heat-dissipating component 37, the opening 32c is formed on the top surface of the fan case 32 since the length of the duct 36 can be reduced.

Referring to FIG. 13 and FIG. 14, a structure in which the first shutter means 39 and the second shutter means 40 are used as shown in FIG. 9 to FIG. 12, has been described. However, the structure shown in FIG. 13 and FIG. 14 may be a structure in which the first shutter means 39 is provided without providing the second shutter means 40 as shown in FIG. 7, or a structure in which the second shutter means 40 is provided without providing the first shutter means 39 as shown in FIG. 8.

Further, for the present embodiment, an exemplary case is described in which the notebook computer 1, in which the cover component 10 having the display device 12 disposed in the inner side surface thereof is pivotably mounted to the main unit 20, is the electronic device. However, the electronic device is not limited to the notebook computer 1 as described above. The electronic device may be various portable electronic devices such as tablet-type personal computers, mobile telephones, hand-held game devices, downsized television receivers, Blu-ray Disc (registered trademark) players, and navigation systems. Further, the electronic device may be various stationary electronic devices such as desktop personal computers and liquid crystal projectors.

Further, according to the present embodiment, the CPU 24 is described as an example of a heat-emitting component which emits heat during operation. The heat-emitting component is not limited to the CPU 24. Various heat-emitting components, such as semiconductor chips in video boards and the like for image processing, and secondary batteries, which emit heat to be released to the exterior of the casings, are considered as the heat-emitting component.

Further, for the present embodiment, an exemplary case is described in which the heat pipe 27 is used to transfer heat from the CPU 24 to the heat-dissipating component 37. However, the heat-dissipating component 37 may be disposed in direct contact with the CPU 24, which is one of the heat-emitting components, so as to enable heat transfer.

As described above, the electronic device of the present disclosure is structured such that air (cooling air) is supplied from the fan through the airflow path to the heat-dissipating component. Consequently, dust on the heat-dissipating component is removed. Thus, according to the present disclosure, an electronic device can be provided which has a built-in heat-dissipating unit that make it possible to restrain increase in cost and increase in the weight, and enables the removal of dust on the heat-dissipating component with a simplified structure.

Further, the electronic device of the present disclosure can be structured such that, in a state where the fan is operating, the first shutter means for opening and closing the air outlet of the fan can be caused to be in the closed state. Thus, flow of air into the airflow path can be increased when dust is removed.

Further, the electronic device of the present disclosure can be structured such that, in a state where the fan is operating, the second shutter means for opening and closing the air outlet of the fan can be caused to be in the closed state. Thus, flow of air into the airflow path can be reduced in a usual usage.

Further, in the electronic device of the present disclosure, the end portion of the airflow path on the heat-dissipating component side can be positioned on the surface of the heat-dissipating component on the side thereof that is reverse from the fan side thereof. Therefore, air (cooling air) is supplied from the fan main unit of the fan through the air flow path to the discharge outlet surface of the heat-dissipating component, and flow of air in a direction opposite to the direction in which air flows during normal usage is generated in the heat-dissipating component. Thus, dust on the inflow surface, which is the end surface of the plurality of fins of the heat-dissipating component on the inflow side thereof where air (cooling air) flows in, can be efficiently removed.

Further, according to the present disclosure, an electronic device may be structured such that the end portion of the air flow path on the heat-dissipating component side is positioned on the surface of the heat-dissipating component on the side that opposes the fan. Therefore, air (cooling air) is supplied from the fan main unit of the fan through the air flow path to the inflow surface of the heat-dissipating component, and the air (cooling air) can be directly blown onto dust on the inflow surface, which is the end surface of the plurality of fins of the heat-dissipating component on the inflow side thereof where air (cooling air) flows in, to remove the dust.

Further, according to the present disclosure, an electronic device may be structured such that the opening is formed on the top surface of the fan case, and the end portion of the air flow path on the heat-dissipating component side is positioned in the upper portion of the heat-dissipating component. Therefore, an airflow path having a reduced length can be used to supply air (cooling air) from the fan to the heat-dissipating component. Further, the air (cooling air) is supplied from the upper portion of the heat-dissipating component toward the bottom side of the communicating path, which is open, thereby enabling efficient removal of dust on the heat-dissipating component.

As described above, the embodiment has been described as an exemplary technique of the present disclosure. For that purpose, the accompanying drawings and the detailed description are provided.

Therefore, components indicated in the accompanying drawings and the detailed description may include not only components which need to be provided in order to solve the problems, but also components which need to be illustrated for describing the implementation but may not be provided for solving the problems. Therefore, the components which may not be provided should not be instantly construed as being indispensable even if the components which may not be provided are indicated in the accompanying drawings and the detailed description.

Further, the embodiment described above is intended to illustrate the technique of the present disclosure. Various modifications, replacements, additions, and deletions may be devised within the scope of claims or within the equivalent scope.

What is claimed is:

1. An electronic device comprising:
   a casing in which electronic components including a heat-emitting component that emits heat during operation are accommodated;
   a heat-dissipating unit having top and bottom sides, the unit being different from the heat-emitting component, and including
      a heat-dissipating component having a plurality of fins to which heat is transferred from the heat-emitting component, the fins defining an air-inflow side and a discharge-outlet side of the heat-dissipating component,
      a fan unit for supplying air to the heat-dissipating component, and
      a fan case accommodating the fan unit, the fan case partially constituting the top and bottom sides of the heat-dissipating unit, and having an air outlet disposed opposite the air-inflow side of the heat-dissipating component, and having a duct-connection opening formed in one of the fan-case sides constituting the top and bottom sides of the heat-dissipating unit, in a location between the fan unit and the fan-case air outlet, and
      a communicating path defined by the fan-case air outlet, by the air-inflow side of the heat-dissipating component, and by an opening formed in the bottom side of the heat-dissipating unit, between the fan-case air outlet and the air-inflow side of the heat-dissipating component, the communicating path communicating the air outlet in the fan case with the air-inflow side of the heat-dissipating component,
whereby the heat-dissipating unit heat-exchanges heat, transferred from the heat-emitting component to the heat-dissipating component, with air supplied from the fan across the communicating path, and releases the heated air through the discharge-outlet side of heat-dissipating component to the exterior of the casing; and
an airflow-ducting component connected to the duct-connection opening and extending, so as to duct airflow, from the duct-connection opening to the heat-dissipating component.

2. The electronic device according to claim 1, wherein the airflow-ducting component extends to the discharge-outlet side of the heat-dissipating component.

3. The electronic device according to claim 1, wherein the airflow-ducting component extends to the air-inflow side of the heat-dissipating component.

4. The electronic device according to claim 1, wherein the duct-connection opening is formed in the top side of the heat-dissipating unit, and the airflow-ducting component duct extends to an upper portion of the heat-dissipating component.

5. The electronic device according to claim 1, comprising a first shutter, provided in the air outlet in the fan case, for opening and closing the air outlet.

6. The electronic device according to claim 1, comprising a second shutter, provided in the duct-connection opening, for opening and closing the duct-connection opening.

* * * * *